United States Patent
West et al.

(10) Patent No.: US 10,461,229 B1
(45) Date of Patent: Oct. 29, 2019

(54) PACKAGE FOR ULTRAVIOLET EMITTING DEVICES

(71) Applicant: RayVio Corporation, Hayward, CA (US)

(72) Inventors: Robert S. West, Pleasanton, CA (US); Yitao Liao, Redwood City, CA (US); Douglas A. Collins, Hayward, CA (US)

(73) Assignee: RayVio Corporation, Hayward, CA (US)

( * ) Notice: Subject to any disclaimer, the term of this patent is extended or adjusted under 35 U.S.C. 154(b) by 0 days.

(21) Appl. No.: 15/923,742

(22) Filed: Mar. 16, 2018

Related U.S. Application Data

(63) Continuation of application No. 14/683,426, filed on Apr. 10, 2015, now Pat. No. 9,947,844.

(51) Int. Cl.
*H01L 33/48* (2010.01)
*H01L 33/58* (2010.01)
*H01L 33/60* (2010.01)
*H01L 27/15* (2006.01)
*H01L 33/36* (2010.01)

(52) U.S. Cl.
CPC ............. *H01L 33/58* (2013.01); *H01L 27/15* (2013.01); *H01L 33/36* (2013.01); *H01L 33/60* (2013.01)

(58) Field of Classification Search
CPC ......... H01L 33/32; H01L 33/38; H01L 33/48; H01L 33/486; H01L 33/501; H01L 33/56; H01L 33/58; H01L 33/60; H01L 33/647
See application file for complete search history.

(56) References Cited

U.S. PATENT DOCUMENTS

| | | |
|---|---|---|
| 2006/0138443 A1 | 6/2006 | Fan et al. |
| 2007/0154823 A1* | 7/2007 | Marson .............. G03F 7/2024 430/30 |
| 2007/0291490 A1* | 12/2007 | Tajul .................. H01L 33/647 362/294 |
| 2009/0001399 A1 | 1/2009 | Diana et al. |
| 2011/0266560 A1 | 11/2011 | Yao et al. |
| 2013/0193464 A1* | 8/2013 | Bae ..................... H01L 33/486 257/94 |
| 2013/0299854 A1* | 11/2013 | Lee ..................... H01L 33/486 257/88 |
| 2014/0084322 A1* | 3/2014 | Park .................... H01L 33/486 257/98 |
| 2014/0106639 A1 | 4/2014 | Harbers |
| 2014/0203311 A1 | 7/2014 | Schowalter et al. |
| 2014/0367734 A1* | 12/2014 | Kneissl ................ H01L 33/32 257/99 |
| 2015/0372204 A1* | 12/2015 | Matsuoka ............ H01L 33/58 250/504 R |

* cited by examiner

*Primary Examiner* — Cuong Q Nguyen
(74) *Attorney, Agent, or Firm* — Patent Law Group LLP; Brian D. Ogonowsky

(57) ABSTRACT

Embodiments of the invention include a light emitting diode including a semiconductor structure including an active layer disposed between an n-type region and a p-type region. The active layer emits UV radiation. A first metal layer is in direct contact with the p-type region. A second metal layer is in direct contact with the n-type region. The first and second metal layers are both formed on a first side of the semiconductor structure. A transparent optic is optically coupled to a major surface of the light emitting diode.

19 Claims, 4 Drawing Sheets

PACKAGE FOR ULTRAVIOLET EMITTING DEVICES

CROSS-REFERENCE TO RELATED APPLICATION

This application is a continuation of U.S. application Ser. No. 14/683,426, titled "Package for Ultraviolet Emitting Devices," filed Apr. 10, 2015 by Robert S. West et al. U.S. application Ser. No. 14/683,426 is incorporated herein by reference.

BACKGROUND

Description of Related Art

The bandgap of III-nitride materials, including (Al, Ga, In)—N and their alloys, extends from the very narrow gap of InN (0.7 eV) to the very wide gap of AlN (6.2 eV), making III-nitride materials highly suitable for optoelectronic applications such as light emitting diodes (LEDs), laser diodes, optical modulators, and detectors over a wide spectral range extending from the near infrared to the deep ultraviolet. Visible light LEDs and lasers can be obtained using InGaN in the active layers, while ultraviolet (UV) LEDs and lasers require the larger bandgap of AlGaN.

UV LEDs with emission wavelengths in the range of 230-350 nm are expected to find a wide range of applications, most of which are based on the interaction between UV radiation and biological material. Typical applications include surface sterilization, water purification, medical devices and biochemistry, light sources for ultra-high density optical recording, white lighting, fluorescence analysis, sensing, and zero-emission automobiles.

DETAILED DESCRIPTION

Though the devices described herein are III-nitride devices, devices formed from other materials such as other III-V materials, II-VI materials, Si are within the scope of embodiments of the invention. The devices described herein may be configured to emit UV A (peak wavelength between 340 and 400 nm), UV B (peak wavelength between 290 and 340 nm), or UV C (peak wavelength between 210 and 290 nm) radiation.

In embodiments of the invention, efficient packages for UV-emitting devices are described. In some embodiments, the packages are used with flip chip UVLEDs.

Figure 1A:
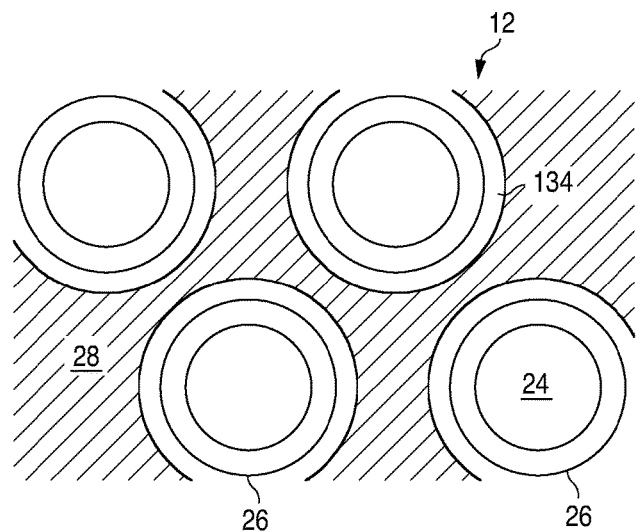
FIG. 1A is a plan view of multiple pixels in a flip chip UV-emitting device (UVLED).
Figure 1B:
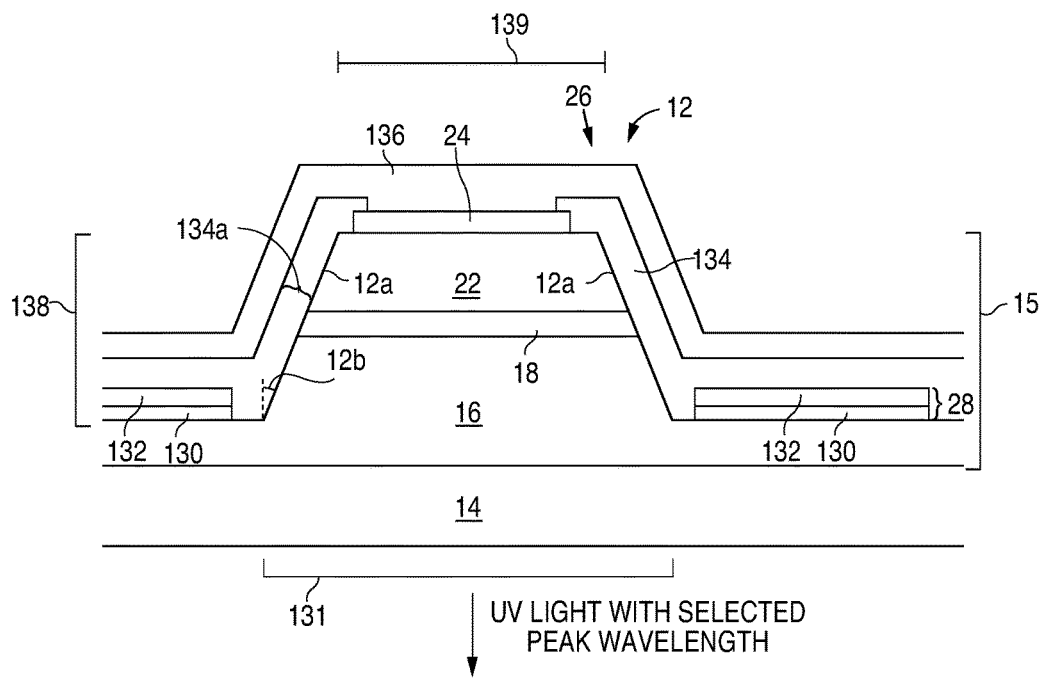
FIG. 1B is a cross sectional view of one pixel in the UVLED.

Commercially available UVA, UVB, and UVC LEDs may be used in the various embodiments. FIGS. 1A and 1B are examples of the assignee's own UVB and UVC LEDs that may be used. FIG. 1A is a top down view of a portion of an array of UVLED pixels 12, and FIG. 1B is a bisected cross-section of a single UVLED pixel 12. Any suitable UVLED may be used and embodiments of the invention are not limited to the device of FIGS. 1A and 1B.

The UVLEDs are typically III-nitride, and commonly GaN, AlGaN, and InGaN. The array of UV emitting pixels 12 is formed on a single substrate 14, such as a transparent sapphire substrate. Other substrates are possible. Although the example shows the pixels 12 being round, they may have any shape, such as square. The light escapes through the transparent substrate, as shown in FIG. 1B. The pixels 12 may each be flip-chips, where the anode and cathode electrodes face the mount (described below).

All semiconductor layers are epitaxially grown over the substrate 14. An AlN or other suitable buffer layer (not shown) is grown, followed by an n-type region 16. The n-type region 16 may include multiple layers of different compositions, dopant concentrations, and thicknesses. The n-type region 16 may include at least one $Al_aGa_{1-a}N$ film doped n-type with Si, Ge and/or other suitable n-type dopants. The n-type region 16 may have a thickness from about 100 nm to about 10 microns and is grown directly on the buffer layer(s). The doping level of Si in the n-type region 16 may range from $1\times10^{16}$ cm$^{-3}$ to $1\times10^{21}$ cm$^{-3}$. Depending on the intended emission wavelength, the AlN mole fraction "a" in the formula may vary from 0% for devices emitting at 360 nm to 100% for devices designed to emit at 200 nm.

An active region 18 is grown over the n-type region 16. The active region 18 may include either a single quantum well or multiple quantum wells (MQWs) separated by barrier layers. The quantum well and barrier layers contain $Al_xGa_{1-x}N/Al_yGa_{1-y}N$, wherein $0<x<y<1$, x represents the AlN mole fraction of a quantum well layer, and y represents the AlN mole fraction of a barrier layer. The peak wavelength emitted by a UV LED is generally dependent upon the relative content of Al in the AlGaN quantum well active layer.

A p-type region 22 is grown over the active region 18. Like the n-type region 16, the p-type region 22 may include multiple layers of different compositions, dopant concentrations, and thicknesses. The p-type region 22 includes one or more p-type doped (e.g. Mg-doped) AlGaN layers. The AlN mole fraction can range from 0 to 100%, and the thickness of this layer or multilayer can range from about 2 nm to about 100 nm (single layer) or to about 500 nm (multilayer). A multilayer used in this region can improve lateral conductivity. The Mg doping level may vary from $1\times10^{16}$ cm$^{-3}$ to $1\times10^{21}$ cm$^{-3}$. A Mg-doped GaN contact layer may be grown last in the p-type region 22.

All or some of the semiconductor layers described above may be grown under excess Ga conditions, as described in more detail in US 2014/0103289, which is incorporated herein by reference.

The semiconductor structure 15 is etched to form trenches between the pixels 12 that reveal a surface of the n-type region 16. The sidewalls 12a of the pixels 12 may be vertical or sloped with an acute angle 12b relative to a normal to a major surface of the growth substrate. The height 138 of each pixel 12 may be between 0.1-5 microns. The widths 131 and 139 at the bottom and top of each pixel 12 may be at least 5 microns. Other dimensions may also be used.

Before or after etching the semiconductor structure 15 to form the trenches, a metal p-contact 24 is deposited and patterned on the top of each pixel 12. The p-contact 24 may include one or more metal layers that form an ohmic contact, and one or more metal layers that form a reflector. One example of a suitable p-contact 24 includes a Ni/Ag/Ti multi-layer contact.

An n-contact 28 is deposited and patterned, such that n-contact 28 is disposed on the substantially flat surface of the n-type region 16 between the pixels 12. The n-contact 28 may include a single or multiple metal layers. The n-contact 28 may include, for example, an ohmic n-contact 130 in direct contact with the n-type region 16, and an n-trace metal layer 132 formed over the ohmic n-contact 130. The ohmic n-contact 130 may be, for example, a V/Al/Ti multi-layer contact. The n-trace metal 132 may be, for example, a Ti/Au/Ti multi-layer contact.

The n-contact 28 and the p-contact 24 are electrically isolated by a dielectric layer 134. Dielectric layer 134 may be any suitable material such as, for example, one or more oxides of silicon, and/or one or more nitrides of silicon, formed by any suitable method. Dielectric layer 134 covers n-contact 28. Openings formed in dielectric layer 134 expose p-contact 24.

A p-trace metal 136 is formed over the top surface of the device, and substantially conformally covers the entire top surface. The p-trace metal 136 electrically connects to the p-contact 24 in the openings formed in dielectric layer 134. The p-trace metal 136 is electrically isolated from n-contact 28 by dielectric layer 134.

Robust metal pads electrically connected to the p-trace metal 136 and n-contact 28 are provided outside of the drawing for connection to power supply terminals. Multiple pixels 12 are included in a single UVLED. The pixels are electrically connected by large area p-trace metal 136 and the large area n-trace metal 132. The number of pixels may be selected based on the application and/or desired radiation output. A single UVLED, which includes multiple pixels, is illustrated in the following figures as UVLED 1.

In some embodiments, substrate 14 is sapphire. Substrate 14 may be, for example, on the order of hundred of microns thick. In a 1 mm square UVLED 1 with a 200 μm thick sapphire substrate, assuming radiation is extracted from the top and sides of the substrate, the top surface accounts for about 55% of the extraction surface, and the sides account for about 45% of the extraction surface of the substrate. Substrate 14 may remain part of the device in some embodiments, and may be removed from the semiconductor structure in some embodiments.

The UVLED may be square, rectangular, or any other suitable shape when viewed from the top surface of substrate 14, when the device is flipped relative to the orientation illustrated in FIG. 1B.

Figure 2:
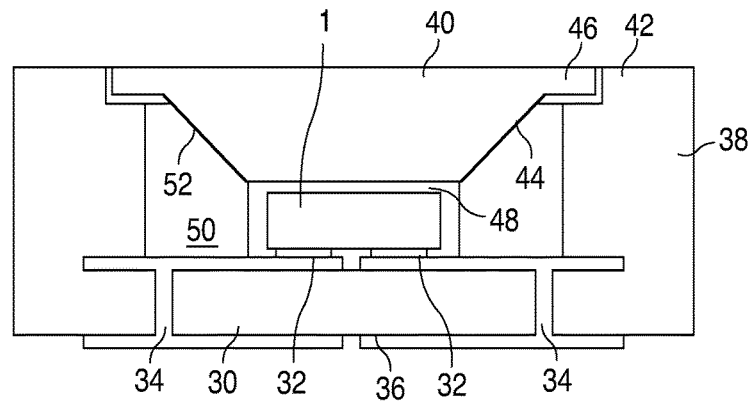
FIG. 2 is a cross sectional view of a packaged UVLED.

FIG. 2 illustrates a UVLED 1 disposed in a package. UVLED 1 is electrically and physically attached to a mount 30. For example, the n- and p-contacts of UVLED 1 may be attached to electrical contacts 32 on the top surface of mount 30 by solder, metal interconnects, or any other suitable electrically conductive and mechanically robust connection.

Mount 30 may be, for example, ceramic, AlN, silicon, silicone, quad flat no lead silicon molding compound, or a metal such Al or Cu which is coated with an insulating layer such as silicon oxide, silicon nitride or aluminum oxide, or any other suitable material. A UV-reflective coating may be formed on any part of the mount that may "see" radiation emitted by the UVLED. Examples of suitable reflective coatings include, for example, reflective particles such as $TiO_2$ disposed in silicone or any other suitable matrix. In some embodiments, circuitry and/or other structures such as transient voltage suppression circuitry, driver circuitry, or any other suitable circuitry may be disposed within mount 30, or mounted on a surface of mount 30, such that the circuitry or other structures are electrically connected to UVLED 1, if necessary.

Electrical contacts 32 on the top surface of mount 30 may be connected to electric contacts 36 on the bottom surface of mount 30 by traces or vias 34 formed within mount 30 or on the surface of mount 30. Bottom contacts 36 may be used to attach the packaged UVLED to another structure, such as a printed circuit board or any other suitable structure.

An optic 40 is disposed over and optically coupled to the top surface of the UVLED 1. Optically coupled as used herein means that radiation is extracted from UVLED 1 into optic 40 without significant scattering or loss. In some embodiments, optic 40 is in direct contact with the substrate 14 of UVLED 1. In some embodiments, a refractive index matching material 48 is disposed between and in contact with both substrate 14 of UVLED 1 and optic 40. Material 48 may serve as an adhesive that attaches optic 40 to UVLED 1.

In some embodiments, optic 40 is a solid material, such that optic 40 directs radiation via total internal reflection (TIR). For example, the optic illustrated in FIG. 2 may be a truncated inverted pyramid or cone, such that the optic has an input area optically coupled to the UVLED 1, an output area opposite the input area, and a sloped sidewall connecting the input area and the output area. At the interface between the sidewalls 44 of optic 40 and air, radiation is totally internally reflected such that it is directed out the top surface (output area) of optic 40. In cross section 52, optic 40 may be, for example, rotationally symmetric, oval, round, square, rectangular, triangular, or any other suitable shape. The surface of the optic 40 that is optically coupled to the top surface of the UVLED may be only slightly larger than the top surface of the UVLED; no more than 10% larger in some embodiments, no more than 20% larger in some embodiments, and no more than 30% larger in some embodiments.

Figure 3:
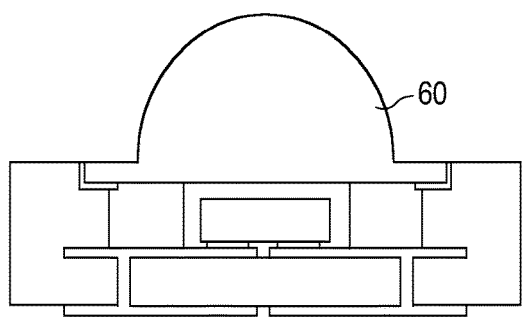
FIG. 3 is a cross sectional view of the package of FIG. 2 with a dome lens.

Optic 40 need not have a sloped sidewall as illustrated in FIG. 2; FIG. 3 illustrates a packaged UVLED with a dome lens 60 instead of optic 40. The domed lens could have a hemispherical, elliptical, or parabolic shape. Other lenses besides dome lenses may be used, such as, for example, Fresnel lenses.

Alternatively, rather than a solid material that reflects light by TIR, optic 40 may be a solid material with a reflective coating such as Al formed on the side surfaces 44, or a hollow body formed by surfaces 44, which may be coated with a UV reflective material such as Al. A hollow optic 40 or reflective-coated solid optic 40 would not rely on TIR to direct the light out of an opening at the top of optic 40, thus there may be greater freedom to choose the shape of side surfaces 44 in a hollow optic or reflective-coated solid optic.

Optic 40 that are solid are formed from a material that is transparent to UV radiation at wavelengths emitted by active region 14, and able to withstand the UV radiation without degrading. For example, in some embodiments, the optic may be formed from a material that transmits at least 85% of UV radiation at 280 nm, when a minimum height of the optic is ~2× the width of the UVLED 1. The transparency of the material may degrade no more than 1% after 1000 hrs of exposure to UV radiation at 280 nm. In some embodiments, optic 40 is formed from a material that is moldable, such as, for example, glass, IHU UV transmissive glass available from Isuzu Glass, Inc., and UV-resistant silicone. In some embodiments, optic 40 is formed from a material that may be shaped by, for example, grinding and polishing, such as quartz or sapphire. An optic formed by molding may be less expensive; an optic formed by grinding and polishing may be of better optical quality.

In the device of FIG. 2, optic 40 is optically coupled to only the top surface of the UVLED 1, typically a surface of the growth substrate 14, or a major surface of the semiconductor structure of UVLED 1. In some embodiments, optic 40 may extend over and be optically coupled to the sides of UVLED 1 as well. Optic 40 may extend over the sides of just the growth substrate 14, or over the sides of both the growth substrate 14 and the semiconductor structure 15.

In some embodiments, a support structure 38 is formed as part of or attached to mount 30. Support structure 38 is disposed along the sides of UVLED 1 and optic 40. Support structure 38 may be transparent or opaque to UV radiation emitted by active region 18. The sidewalls of support structure 38 that face UVLED 1 and optic 40 may be reflective to UV radiation. Support structure 38 may be formed of metal, plastic, ceramic, or any other suitable material.

In some embodiments, optic 40 includes one or more tabs 46 which are wider than the opening formed by support structure 38. Tabs 46 may rest in notches formed in the top surface of support structure 38, as illustrated in FIG. 2, or on the top surface of support structure 38. Optic 40 may thus be mechanically supported by support structure 38. An adhesive material 42 may be disposed between tabs 46 and support structure 38. Examples of suitable adhesive materials include silicone. The top surfaces of support structure 38 and optic 40 may be flush as illustrated in FIG. 2, though this is not required.

In some embodiments, as illustrated in FIG. 2, the top of optic 40 is wider than UVLED 1, such that a cavity 50 is formed between UVLED 1 and support structure 38. Cavity 50 may be filled with air or any other suitable gas, liquid, gel, or solid material. The material chosen to fill cavity 50 could be an epoxy or other suitable material to mechanically support the optic, a material with higher thermal conductivity than air to assist in heat transfer out of the UVLED 1, or a diffusion barrier to protect the UVLED 1 from the surrounding environment. If optic 40 relies on TIR, the shape of surface 44 may be optimized to account for the difference in index of refraction between optic 40 and the material in cavity 50. However, if optic 40 is a hollow optic with reflective surfaces 44 or a reflective-coated solid material, the optimal shape of optic 40 is not affected by the material in cavity 50.

In some embodiments, a coating is disposed on the sides of UVLED 1. In some embodiments, if the optic is only optically coupled to the top surface of UVLED 1, the sides of UVLED 1 are not coated, as total internal reflection at the interface of the side of the substrate and air may reflect radiation back into the UVLED where it may be extracted from the top surface. However, for manufacturing and/or reliability reasons, the sides of UVLED 1 may be coated, for example to protect the UVLED, or in order to use a method such as spin coating that would necessarily coat both the top and side surfaces of UVLED 1.

Figure 5:
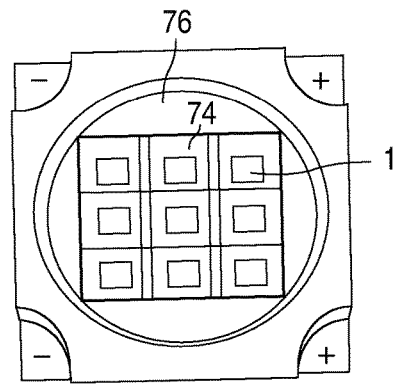
FIG. 5 is a plan view of an array of UVLEDs in a package.
Figure 4:
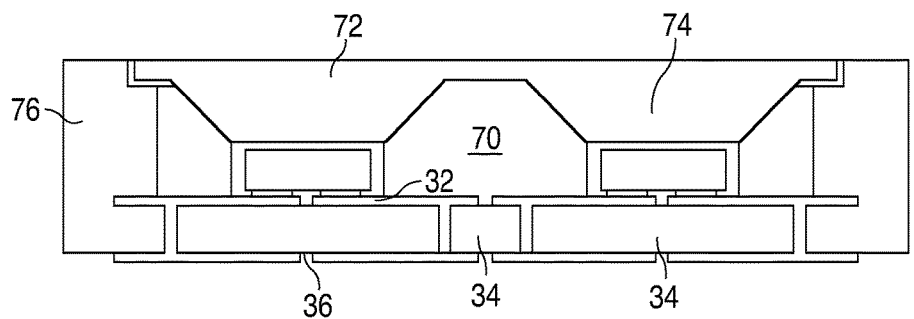
FIG. 4 is a cross sectional view of a package including multiple UVLEDs.

FIG. 4 is a cross sectional view of a device including multiple UVLEDs 1 in a single package. Though two UVLEDs 1 are illustrated, more may be included. FIG. 5 is a plan view of a package include 9 UVLEDs 1 arranged in a 3×3 array. More or fewer UVLEDs 1 may be used, and the arrangement is not limited to the square array illustrated.

In the device of FIG. 4, the UVLEDs 1 are electrically and physically attached to a mount 30, which may be the same as the mount described above in reference to FIG. 2. An integrated optic 72 is disposed over UVLEDs 1. Integrated optic 72 includes multiple connected optics 74, each optic 74 aligned with a UVLED 1. Optics 74 may be the same as optic 40 or lens 60 described above in reference to FIGS. 2 and 3. Integrated optic 72 may be attached to individual UVLEDs 1, and/or to a support structure 76 that surrounds all the UVLEDs 1 in the package. Support structure 76 may be the same as the support structure described above in reference to FIG. 2. Cavities 70 between neighboring UVLEDs 1 may be filled with air or any other suitable material, as described above.

Figure 12:
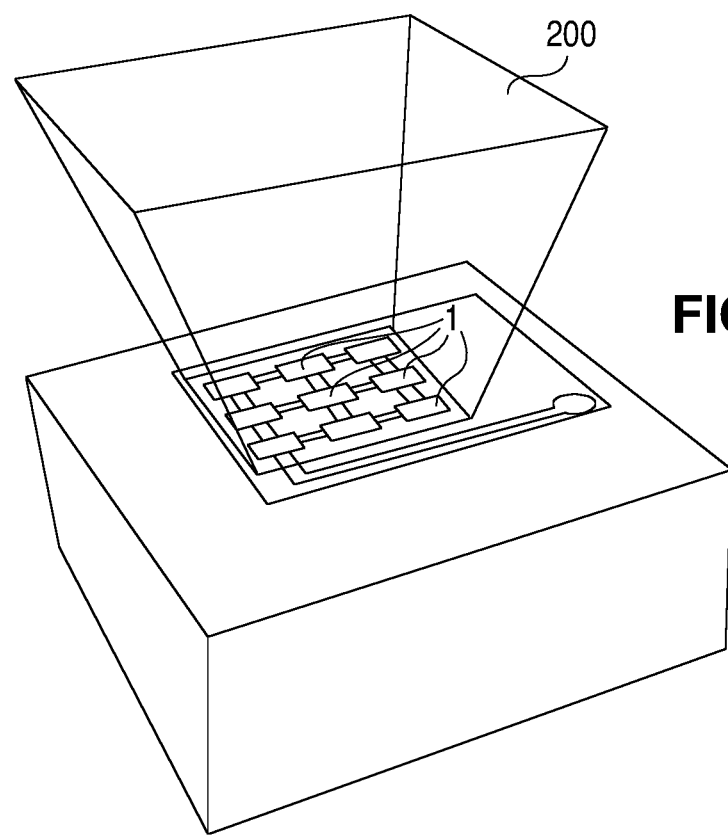
FIG. 12 illustrates an optic optically coupled to multiple UVLEDs.

In the device of FIG. 12, a single optic is optically coupled to more than one UVLED. In the device of FIG. 12, a single optic 200 is optically coupled to the top surfaces of 9 UVLEDs 1, positioned on a mount in a 3×3 array. More of fewer UVLEDs may be used, and the invention is not limited to UVLEDs disposed in a square array. The optic 200 may be a solid, TIR optic, a solid optic with a reflective coating on the sidewalls, or a hollow optic with reflective sidewalls. A single optic disposed over multiple UVLEDs has the advantage of greater mechanical strength and lower optics manufacturing costs.

In some embodiments, the packages described and illustrated above may be optimized for a near-field application such as, for example, printing, where UV radiation may be used to cure ink; disinfection; or any other suitable application. Near field applications may require high irradiance (defined as power per area, often $mW/cm^2$) and high uniformity in a target area that is close to the optic.

For example, near field applications may require a given irradiance and uniformity at a target area no more than 10 mm from the optic in some embodiments, no more than 6 mm from the optic in some embodiments, and no more than 3 mm from the optic in some embodiments. The required irradiance at the target may be at least 100 $mW/cm^2$ in some embodiments, at least 150 $mW/cm^2$ in some embodiments, and at least 200 $mW/cm^2$ in some embodiments. The required uniformity may be no more than a 15% variation from an average irradiance in some embodiments, no more than a 10% variation from an average irradiance in some embodiments, and no more than a 5% variation from an average irradiance in some embodiments.

Figure 6:
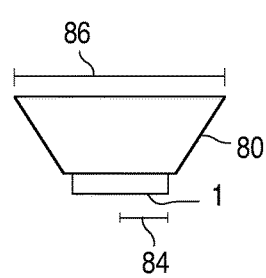
FIG. 6 is a cross sectional view of a package including a UVLED optically coupled to an optic.
Figure 7:
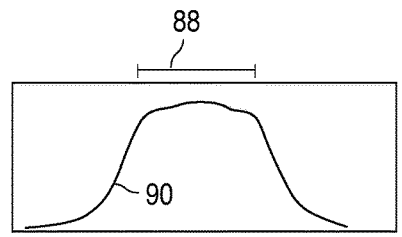
FIG. 7 illustrates the emission power as a function of position, for the radiation emitted by the system of FIG. 6.

The required uniformity may be achieved by selecting the size and shape of the optic. FIG. 6 illustrates a simplified cross sectional view of a TIR optic 80 optically coupled to a UVLED 1. FIG. 7 illustrates the emission pattern 82 from the top of one example of optic 80. The optic with the emission pattern illustrated in FIG. 7 has a width 84, from the center to the edge of the optic, of 700 μm. The optic has a width 86 at the top of 2.2 mm. The optic has a square cross section, taken along a plane parallel to a major surface of UVLED 1. As illustrated in FIG. 7, the emission pattern is substantially uniform in a center region 88, though the emission drops off at the furthest edges 90 of the optic.

Figure 8:
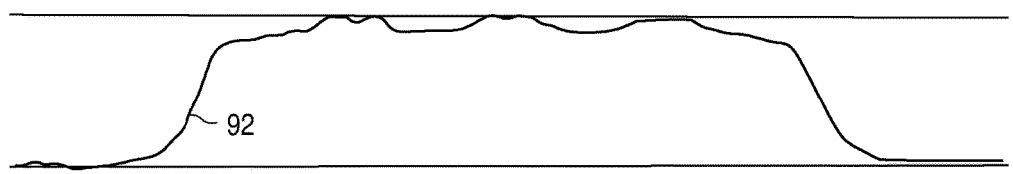
FIG. 8 illustrates the emission power as a function of position, for the radiation emitted by the array of FIG. 9.
Figure 9:
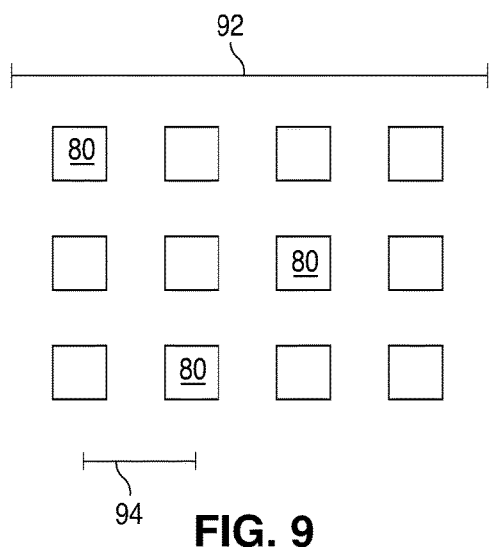
FIGS. 9 and 10 illustrate arrays of optics coupled to UVLEDs.
Figure 10:
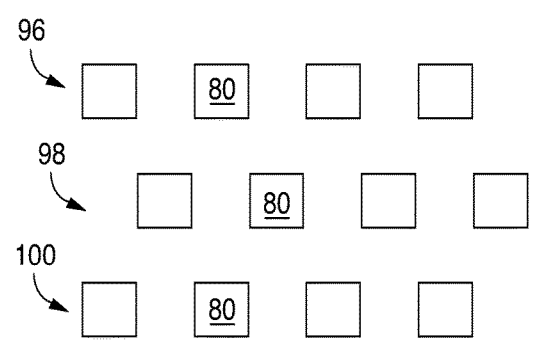

If a larger area than the area corresponding to a single optic is to be irradiated, an array of optics may be formed, as illustrated in FIGS. 9 and 10. FIG. 8 illustrates the emission pattern 92 from the array illustrated in FIG. 9. The number of optics 80 depends on the size of the area to be irradiated; 12 optics 80 disposed over 12 UVLEDs are illustrated in FIG. 9. The optics are spaced 94 on 4 mm centers. The optics are arranged in a square array. As illustrated in FIG. 8, the array illustrated may meet the uniformity requirement described above.

In the array in FIG. 10, three lines of optics 80, lines 96, 98, and 100, are staggered. Alternating lines 96 and 100 may be aligned, as illustrated, though this is not required. The optics may be arranged in any other suitable arrangement, depending on the application.

As an alternative to the arrays of optics illustrated in FIGS. 9 and 10, a single large optic for multiple LEDs as shown in FIG. 12 may be used.

Suitably uniform emission patterns may be formed by TIR optics 80 having a bottom width 84 of at least 500 µm in some embodiments, at least 600 µm in some embodiments, no more than 1500 µm in some embodiments, no more than 1000 µm in some embodiments, and no more than 800 µm in some embodiments. Suitably uniform emission patterns may be formed by TIR optics 80 having a top width 86 of at least 1.5 mm in some embodiments, at least 2 mm in some embodiments, no more than 5 mm in some embodiments, no more than 4 mm in some embodiments, and no more than 3 mm in some embodiments. Suitably uniform emission patterns may be formed by arrayed TIR optics 80 spaced 94 at least 3 mm apart in some embodiments, at least 3.5 mm apart in some embodiments, no more than 7 mm apart in some embodiments, no more than 6 mm apart in some embodiments, and no more than 5 mm apart in some embodiments.

As illustrated in FIGS. 2, 3, 4, 6, and 12, in some embodiments, only the top surface of UVLED 1 is optically coupled to the optic 40, 60, 74 or 80. The side surfaces of UVLED 1 are not optically coupled to the optic, such that radiation emitted from the side surfaces is lost. Capturing the radiation from just the top surface increases the etendue of the UVLED/optic system. Increasing the etendue may increase the irradiance of the system and reduce the source size, which may be useful for some applications. The radiation emitted to the side is discarded in these embodiments, though in UV-emitting systems, radiation may preferentially be emitted toward the side surfaces of a UVLED, rather than the top surface of the UVLED, due to polarization within the AlGaN active layer(s).

Figure 11:
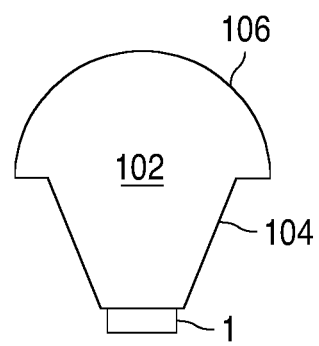
FIG. 11 illustrates an optic with a total internal reflection surface and another surface.

In embodiments where the optic is a solid material that directs radiation by total internal reflection such as, for example, the optics illustrated in FIGS. 2, 4, 6, and 12, the optic may have a TIR surface combined with other surfaces that may or may not direct radiation by TIR. For example, FIG. 11 illustrates a UVLED 1 optically coupled to an optic 102 with a TIR surface 104 near the UVLED 1, and a domed surface 106 spaced apart from UVLED. In the TIR optics described herein, a majority of radiation encountering the TIR surface may be reflected by TIR. Alternatively, in the structure illustrated in FIG. 11, surface 104 may be coated with a reflective material, such as Al, which may reduce the constraints on the shape of surface 104.

Having described the invention in detail, those skilled in the art will appreciate that, given the present disclosure, modifications may be made to the invention without departing from the spirit of the inventive concept described herein. In particular, different features and components of the different devices described herein may be used in any of the other devices, or features and components may be omitted from any of the devices. A characteristic of, for example, the optic, described in the context of one embodiment, may be applicable to any embodiment. Therefore, it is not intended that the scope of the invention be limited to the specific embodiments illustrated and described.

What is being claimed is:

1. A device comprising:
   a light emitting diode comprising a semiconductor structure comprising an active layer disposed between an n-type region and a p-type region, wherein the active layer emits UV radiation;
   a mount, wherein the light emitting diode is disposed on the mount, the mount comprising a support structure that surrounds the light emitting diode;
   the support structure defining a cavity within which the light emitting diode is located, the support structure providing a first surface surrounding a top of the cavity;
   a transparent optic disposed over the light emitting diode, the transparent optic comprising tabs extending from a top portion of the optic, where the tabs rest on the first surface of the support structure; and
   the optic being a pre-formed solid structure that is positioned within the cavity such that the optic only takes up a portion of the cavity, wherein there is a gap between sidewalls of the cavity and the optic, the optic tapering inward as it approaches the light emitting diode within the cavity.

2. The device of claim 1 wherein the tabs have a bottom surface that is substantially parallel to a major surface of the light emitting diode, and the transparent optic comprises a sloped sidewall disposed between the tabs and a top surface of the light emitting diode.

3. The device of claim 1 wherein the cavity is filled with a material selected from the group consisting of air, gas, liquid, gel, and solid material.

4. The device of claim 1 further comprising an adhesive disposed between the transparent optic and the support structure.

5. The device of claim 1 further comprising a first metal layer in direct contact with the p-type region and a second metal layer in direct contact with the n-type region, wherein the first and second metal layers are both formed on a first side of the semiconductor structure.

6. The device of claim 1 further comprising an index matching material disposed between the light emitting diode and the transparent optic.

7. The device of claim 1 further comprising a transparent growth substrate disposed on the semiconductor structure.

8. The device of claim 1 wherein the light emitting diode is a first light emitting diode, the device further comprising a second light emitting diode, wherein the transparent optic is disposed over the second light emitting diode.

9. The device of claim 1 wherein top surfaces of the transparent optic and the support structure are flush.

10. The device of claim 1 wherein the transparent optic is a moldable material.

11. The device of claim 1 wherein the transparent optic is one of quartz, sapphire, and glass.

12. The device of claim 1 wherein the transparent optic comprises a plurality of discrete tabs.

13. A device comprising:
    an array of ultraviolet (UV) radiation sources, each UV radiation source comprising a light emitting diode, each light emitting diode comprising a semiconductor structure comprising an active layer disposed between an n-type region and a p-type region, wherein the active layer emits UV radiation;
    the UV radiation sources being mounted in a single cavity of a support structure, the support structure providing a first surface surrounding a top of the cavity;

a transparent optic disposed over the UV radiation sources, the transparent optic comprising tabs extending from a top portion of the optic, where the tabs rest on the first surface of the support structure; and the optic being a pre-formed solid structure that is positioned within the cavity such that the optic only takes up a portion of the cavity, wherein there is a gap between sidewalls of the cavity and the optic, the optic tapering inward as it approaches each of the UV radiation sources within the cavity.

14. The device of claim 13 wherein the optic comprises:
an input area optically coupled to a major surface of each of the UV radiation sources;
an output area opposite the input area, wherein the output area is larger than the input area; and
a sloped sidewall connecting the input area to the output area.

15. The device of claim 14 wherein each optic is a solid, transparent material and the sidewall reflects a majority of radiation incident on the sidewall by total internal reflection.

16. The device of claim 14 wherein each optic is a solid, transparent material and the sidewall is coated with a reflective material.

17. The device of claim 14 wherein each optic is hollow and the sidewall is reflective.

18. The device of claim 13 wherein the average irradiance within the target area is at least 100 mW/cm$^2$.

19. The device of claim 13 wherein the UV radiation sources are arranged such that in a target area no more than 10 mm from the UV radiation sources and substantially the same size as the array, an irradiance at any point in the target area varies no more than 15% from an average irradiance within the target area.

* * * * *